United States Patent
Fukuda et al.

(10) Patent No.: US 8,232,191 B2
(45) Date of Patent: Jul. 31, 2012

(54) SEMICONDUCTOR DEVICE MANUFACTURING METHOD

(75) Inventors: Masahiro Fukuda, Kawasaki (JP); Yosuke Shimamune, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 12/855,897

(22) Filed: Aug. 13, 2010

(65) Prior Publication Data

US 2011/0014765 A1  Jan. 20, 2011

Related U.S. Application Data

(62) Division of application No. 12/026,917, filed on Feb. 6, 2008, now abandoned.

(30) Foreign Application Priority Data

Feb. 7, 2007 (JP) ................................. 2007-028345

(51) Int. Cl.
*H01L 21/44* (2006.01)

(52) U.S. Cl. ........ 438/607; 438/191; 438/752; 438/933; 438/938

(58) Field of Classification Search .................. 438/191, 438/607, 938, FOR. 237, FOR. 293, FOR. 484, 438/752, 933, FOR. 134, FOR. 291
See application file for complete search history.

(56) References Cited

U.S. PATENT DOCUMENTS

| | | | |
|---|---|---|---|
| 6,724,008 B2 | 4/2004 | Fitzergald | |
| 6,724,019 B2 | 4/2004 | Oda et al. | |
| 7,138,310 B2 * | 11/2006 | Currie et al. | 438/199 |
| 7,335,545 B2 * | 2/2008 | Currie | 438/197 |
| 2004/0058482 A1 | 3/2004 | Yoshida et al. | |
| 2005/0151134 A1 | 7/2005 | Hsu et al. | |
| 2008/0121929 A1 * | 5/2008 | Lai et al. | 257/190 |
| 2008/0164491 A1 | 7/2008 | Liu et al. | |
| 2008/0179627 A1 * | 7/2008 | Ieong et al. | 257/190 |

FOREIGN PATENT DOCUMENTS

| | | |
|---|---|---|
| JP | 2003-128494 A | 5/2000 |
| JP | 2003-163361 A | 6/2003 |
| JP | 2003-178975 A | 6/2003 |
| JP | 2004-103805 A | 4/2004 |
| JP | 2004-241507 A | 8/2004 |

OTHER PUBLICATIONS

T. Ghani et al; "IEDM Technical Digest," IEEE, Washington DC; Dec. 2003, pp. 978-980.
K. Ang et al; "IEDM Technical Digest," IEEE, San Francisco; Dec. 2004, pp. 1069-1071.
Y.S. Kim et al; "Proceedings of ESSDERC 2005," Grenoble, France; Sep. 2005, pp. 305-308.

* cited by examiner

*Primary Examiner* — N Drew Richards
*Assistant Examiner* — Joannie A Garcia
(74) *Attorney, Agent, or Firm* — Westerman, Hattori, Daniels & Adrian, LLP

(57) ABSTRACT

A method of manufacturing a semiconductor device including forming a gate insulating film and a gate electrode over a Si substrate; forming a recess in the Si substrate at both sides of the gate electrode; forming a first Si layer including Ge in the recess; forming an interlayer over the first Si layer; forming a second Si layer including Ge over the interlayer; wherein the interlayer is composed of Si or Si including Ge, and a Ge concentration of the interlayer is less than a Ge concentration of the first Si layer and a Ge concentration of the second Si layer.

5 Claims, 5 Drawing Sheets

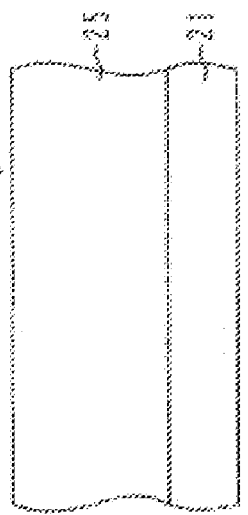
FIG.1A
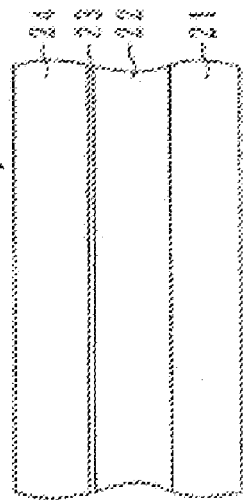
FIG.1B
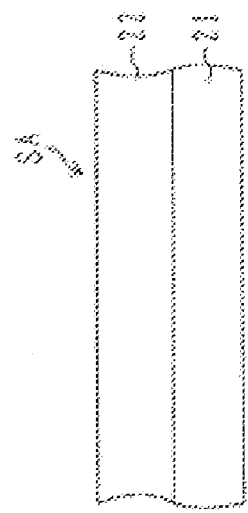
FIG.1C
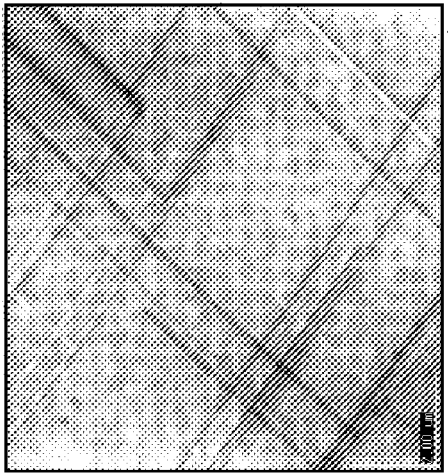
FIG.1D
2.00 μm
FIG.1E
2.00 μm
FIG.1F
2.00 μm

SEMICONDUCTOR DEVICE MANUFACTURING METHOD

CROSS-REFERENCE TO RELATED APPLICATIONS

This application is a Divisional application of U.S. patent application Ser. No. 12/026,917, filed on Feb. 6, 2008, which is based upon and claims the benefit of priority from the prior Japanese Patent Application No. 2007-28345, filed on Feb. 7, 2007, the entire contents of which are incorporated herein by reference.

TECHNICAL FIELD

The present invention relates to a semiconductor device and a manufacturing method thereof and more specifically to a semiconductor device comprising a MOS transistor having a stress applying mechanism and a manufacturing method thereof.

BACKGROUND

Improvement in fine structures has been continuing for improving integration density and also improving processing speed of a silicon semiconductor integrated circuit. Gate length of the MOS transistor has been shortened in combination with further improvement in fine structure. When the gate length is 65 nm or less, expectation for improvement of performance with a fine structure has been accompanied by limitations.

A strain transistor for improving mobility of carriers by creating a strain is a technology for realizing improvement in performance of the MOS transistor. Strain is generated by impressing stress to a channel region of a MOS transistor. ON-current is improved by raising mobility of electrons and holes.

An n-channel MOS transistor can improve mobility of electrons when a tensile stress is impressed to the channel region thereof A p-channel MOS transistor can improve mobility of holes when a compressed stress is impressed to the channel region thereof.

In the case of a PMOS transistor, when a source/drain region is formed with a silicon-germanium (SiGe) mixed crystal having a lattice constant larger than that of the Si substrate, a compressed stress is applied to the Si crystal of the channel region and thereby mobility of hole increases.

In the case of NMOS transistor, when the source/drain region is formed with a silicon-carbon (SiC) mixed crystal having the lattice constant smaller than that of the Si substrate, a tensile stress is applied to the Si crystal of the channel region and thereby mobility of electrons increases.

When the Si—Ge crystal is formed with the epitaxial growth on the Si substrate, thickness of the epitaxial layer which can be grown without misfit dislocation is limited to the thickness called the critical film thickness.

SUMMARY

According to an aspect of the invention, a semiconductor device has a Si substrate, a gate insulating film over the Si substrate, a gate electrode over the gate insulating film, a source region and a drain region in the Si substrate, wherein each of the source region and the drain region includes a first Si layer including Ge, a interlayer over the first Si layer, and a second Si layer including Ge over the interlayer, wherein the interlayer is composed of Si or Si including Ge, and a Ge concentration of the interlayer is lower than a Ge concentration of the first Si layer and a Ge concentration of the second Si layer.

It is also possible to form the device of the current invention by substituting SiC for SiGe.

BRIEF DESCRIPTION OF THE DRAWINGS

FIGS. 1A to 1C are schematic cross-sectional views showing structures of samples SA, SB, and SC, while FIGS. 1D to 1F are electron microscope images of Atomic Force Microscope (AFM) at the surface of the samples SA, SB, and SC.

DETAILED DESCRIPTION OF THE PREFERRED EMBODIMENT

In order to manufacture a strain PMOS transistor, a recess is formed by etching the region schemed as the source/drain area of the Si substrate and a SiGe film is formed by epitaxial growth on the Si crystal of the recess. The SiGe film may include other elements for example C. In view of avoiding dislocation, the SiGe film which is thinner than the critical film thickness determined by the Ge composition is grown. When the SiGe film is grown exceeding a predetermined film thickness, dislocation is generated in the SiGe film. The maximum thickness not generating dislocation is called the critical film thickness. When dislocation is generated, a stress is released and it becomes impossible to effectively apply strain to the channel. Therefore, film thickness is set thinner than the critical film thickness or the Ge composition is lowered. In any case, a stress to be applied to the channel region is reduced if the critical film thickness requirements are not met.

Critical film thickness in the hetero-epitaxial growth will be explained hereunder. Here, it is assumed that a SiGe mixed crystal is formed by epitaxial growth on the surface of a Si substrate. When Ge composition x in the SiGe mixed crystal expressed by $Si_{1-x}Ge_x$ is higher than about 0.2, the further the thickness of the epitaxial layer increases, the more strain energy to be accumulated increases also and dislocation is generated at a certain thickness. This dislocation is called the misfit dislocation. Critical film thickness also depends on film forming temperature.

Figure 5:
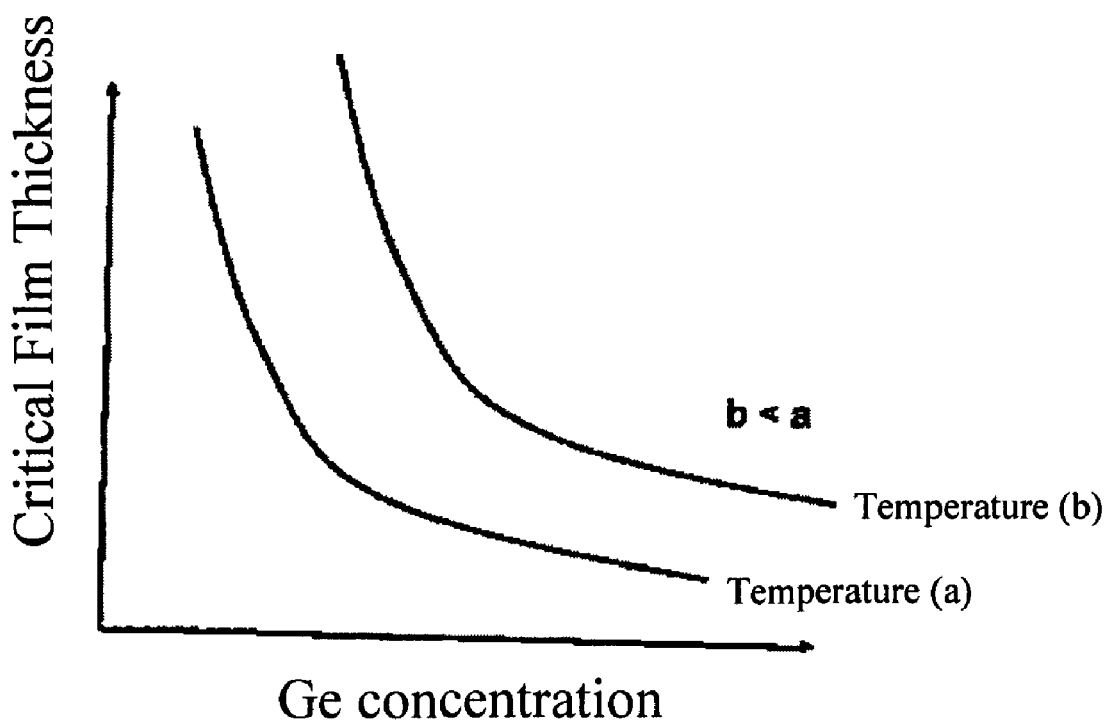
FIG. 5 is a graph showing change in the critical film thickness.

FIG. 5 is a graph showing the relationship of the critical film thickness for Ge concentration. The vertical axis shows the critical film thickness, while the horizontal axis shows the Ge concentration. When epitaxial growth occurs at the temperature (a), the more the Ge concentration increases, the larger the lattice constant of SiGe becomes and thereby the critical film thickness becomes small. When temperature (a) is set to a lower value (b), the critical film thickness increases. In the case where the SiGe mixed crystal in the lattice constant different from that of Si is grown without generation of misfit dislocation on the Si crystal, the thickness thereof is restricted by the critical film thickness.

As explained above, when the Ge concentration becomes greater, the critical film thickness of SiGe becomes small and therefore dislocation is easily generated within SiGe. When dislocation is generated within SiGe, strain accumulated within SiGe is also released and therefore a stress applied to Si also becomes small.

When it is requested to apply, for example, a compressed stress to the channel of MOS transistor, the compressed stress is applied from the sides of the source and drain to the channel by first forming a recess by etching the Si substrate at the part where the source/drain region is formed, and next, the SiGe mixed crystal having the lattice constant larger than that of Si is formed by epitaxial growth within the recess. The larger the compressed stress is, the further the mobility of holes becomes. According to the present invention, it is possible to form the SiGe layer with a thickness exceeding the critical film thickness under the condition that generation of dislocation is controlled, and thereby the compressed stress is applied more effectively. Specifically, the inventors of the present invention have experimented with the influence on misfit dislocation under the condition that the layer having larger difference of lattice constant is divided with the layer having smaller lattice constant in the thickness direction.

FIGS. 1A, 1B and 1C show three kinds of cross-sectional structures of samples. FIG. 1A shows a first sample SA. A $Si_{0.76}Ge_{0.24}$ layer 22 is epitaxially grown in the thickness of 25 nm on the surface of the Si substrate. A $Si_{0.76}Ge_{0.24}$ means that the SiGe mixed Crystal includes 76% Si and 24% Ge in atomic %. FIG. LB shows a second sample SB. A $Si_{0.76}Ge_{0.24}$ layer 22 is epitaxially grown in the thickness of 25 nm on the Si substrate 21, a Si layer 23 is epitaxially grown thereon in the thickness of 3 nm, and moreover a $Si_{0.76}Ge_{0.24}$ layer 24 is epitaxially grown in the thickness of 25 nm. FIG. 1C shows a third sample SC. A $Si_{0.76}Ge_{0.24}$ layer 25 is epitaxially grown in the thickness of 50 nm on the front surface of the Si substrate 21. The total thickness of the SiGe layer is 50 nm in the second sample SB and the third sample SC.

The epitaxial growth has been executed under the substrate temperature range from 500° C. to 700° C. using the mixed gas of $SiH_4$, $GeH_4$, HCl, and $H_2$. The Ge composition has been controlled depending on a partial pressure ratio of the mixed gas.

FIGS. 1D, 1E, and 1F show images of AFM at the surfaces of the samples SA, SB, and SC. AFM of the sample SA of FIG. 1D shows a flat front surface. Meanwhile, AFM of the sample SC of FIG. 1F shows generation of cross-hatched stepped portion. The stepped portion corresponds to a dislocation portion. Here, it is assumed that strain energy accumulated in the SiGe layer 25 becomes too large to be held within the epitaxial layer 25 and thereby misfit dislocation has been generated. In regard to the sample SA of FIG. 1D, it is assumed that the stepped portion is never generated, thickness of the epitaxial layer 22 is equal to or less than the critical film thickness, and misfit is not easily generated. As explained above, generation of dislocation may be determined with AFM.

AFM of the sample SB of FIG. 1E shows limited generation of stepped portions. The density thereof is extraordinarily smaller than that of the stepped portions of the sample SC of FIG. 1F. A sum of thickness of the SiGe layers 22, 24 is 50 nm which is identical to the thickness of SiGe layer 25 of the sample SC, but generation of dislocation is reduced. According to these experiments, it has been determined that when a thinner Si layer is inserted into the intermediate location in the thickness direction of a SiGe layer with a total thickness of 50 nm, generation of dislocation is reduced.

Adjustment of thickness or the like in each layer results in an epitaxial layer with less dislocation. A similar effect can also be expected by inserting a layer having small difference of lattice constant from the substrate into the intermediate location in the thickness direction of the layer having a large difference of lattice constant. Namely, it is possible to use SiGe having small Ge composition in place of the Si layer.

Other materials may be used as the epitaxial layer having a large difference of lattice constant from the substrate. A mixed crystal having a lattice constant smaller than that of Si may be substituted for the SiGe mixed crystal having a lattice constant larger than that of Si. For example, it is also possible to attain a similar effect by using the SiC mixed crystal having a diamond structure like Si and a lattice constant smaller than that of Si and then increasing the Si layer or the SIC mixed crystal having small C composition into the intermediate location in the thickness direction. With the SiC mixed crystal having a small lattice constant, a larger tensile stress can be applied. A large tensile stress can be applied to the channel of NMOS transistor by arranging the SiC laminated layer having the sum of thickness exceeding the critical film thickness to the source/drain of NMOS transistor. The larger tensile stress contributes to improving mobility of electrons.

A layer having a smaller lattice constant for the substrate inserted to the intermediate location may not be limited only to a single layer. It is possible to attain a larger total sum of thickness in the epitaxial layer having a large difference of lattice constant from the substrate.

The B-doped type p SiGe/Si/SiGe epitaxial layer has also been formed by epitaxial growth by adding $B_2H_6$ as the impurity source gas. Boron concentration is set from $1E19\ cm^{-3}$ to $1E21\ cm^{-3}$, but electric activation coefficient of boron taken into the epitaxial layer has almost reached 100% even in the case of high concentration doping of about $1E20\ cm^{-3}$.

Various epitaxial growth conditions may be introduced. For example, $Si_2H_2$, $SiH_2Cl_2$ or the like may be used as the source gas of Si, while $Ge_2H_6$ or the like may be used as the source gas of Ge. In the case of laminated layers of SiC/Si or SiC/SiC, the epitaxial growth of SiC may be conducted under the substrate temperature range from 600° C. to 900° C. using $SiH_3$ as the C source. As the type n impurity, $PH_3$, $AsH_3$ or the like may be used.

Figure 2A:
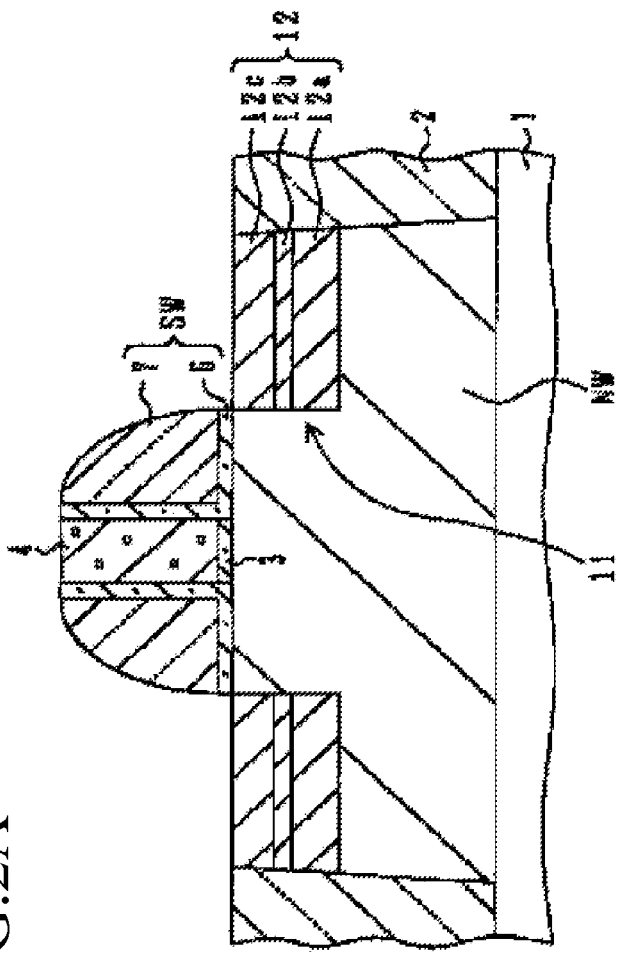
FIGS. 2A and 2B are cross-sectional views of the semiconductor device of the first embodiment and a modified example thereof.

FIG. 2A is a cross-sectional diagram showing the semiconductor device of the first embodiment on the basis of experimental results detailed above. An element isolating region 2 is formed in the Si substrate 1 with Shallow Trench Isolation (STI) method and type n impurity is ion-implanted to an active region defined with the element isolating region 2 in order to form a type n well NW. For example, a gate insulating film 3 formed with a silicon oxide film in the thickness of 1 nm to 2 nm and a p-type impurity-doped such as boron-doped polysilicon film 4 are laminated on the front surface of active region and then this laminated layer is patterned to constitute a gate electrode. On the side-wall of the gate electrodes 4, 3, insulating side-wall spacers SW are formed with the laminated layers of silicon oxide film 6 and silicon nitride film 7. The structure explained above allows various substitutions, variations and modifications. For example, the gate insulating film 3 may also be formed of laminated layers of the silicon nitride oxide film, silicon oxide film and a film of material having higher specific dielectric coefficient. The side-wall spacer SW may be formed of a single layer or of laminated layers of the other materials.

The recess 11 is formed by etching of the Si substrate in both sides of the insulating side-wall spacer SW and the first SiGe layer 12a with higher Ge composition, the second SiGe layer 12b with lower Ge composition, and the third SiGe layer 12c with higher Ge composition are epitaxially formed within the recess. When composition of the first SiGe layer 12a is expressed as $Si_{1-x}Ge_x$, while composition of the second SiGe layer as $Si_{1-y}Ge_y$, and composition of the third SiGe layer as $Si_{1-z}$—$Ge_z$, x and z are set to satisfy the relationship of $0.2 \leq \forall (x, z) \leq 0.4$ and y is also set to satisfy the relationship of $0 \leq y < \forall(x, z)$. $\forall(x, z)$ means both x and z. The first to third SiGe epitaxial layers are all designated as 12. Boron is doped in to concentration of $1E19\ cm^{-3}$ to $1E21\ cm^{-3}$ to the SiGe epitaxial laminated layer 12.

Generation of dislocation may be reduced even if the total sum of the first and the third SiGe layer becomes large with epitaxial growth of the first and third SiGe layer with higher Ge composition in both sides of the second SiGe layer with lower Ge composition.

It is also possible to form an n-channel MOS transistor by inverting all conductivity types of impurity, substituting the SiGe layer with SiC layer and then selecting C composition in place of Ge composition. Silicon-carbon mixed crystal (SiC) also may include other elements.

On the occasion of using the SiC layer, when composition of the first SiC layer is expressed as $Si_{1-x}C_x$, composition of the second SiC layer as $Si_{1-y}C_y$, composition of the third SiC as $Si_{1-z}C_z$, x and z are set to satisfy the relationship of $0.01 \leq \forall (x, z) \leq 0.02$ and y is also set to satisfy the relationship of $0 \leq y < \forall(x, z)$. Here, $\forall(x, z)$ means both x and z.

Figure 2B:
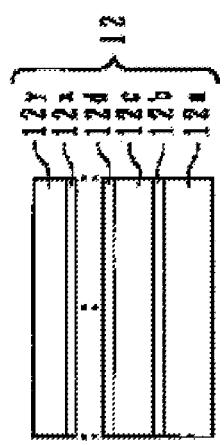

FIG. 2B is a cross-sectional diagram showing a modified example of the first embodiment. The SiGe epitaxial laminated layer 12 embedded in the recess is formed thinner than the critical film thickness and includes the SiGe layers 12a, 12c, . . . , 12y having higher Ge composition and a plurality of SiGe layers 12b, 12d, . . . , 12x inserted to divide these above layers and to have lower Ge composition. The SiGe layers 12 are all formed as the epitaxially grown layers. Other points are identical to the first embodiment.

FIGS. 3A to 3F are cross-sectional diagrams showing the principal steps in the manufacturing method for manufacturing the semiconductor device shown in FIG. 2A.

Figure 3A:
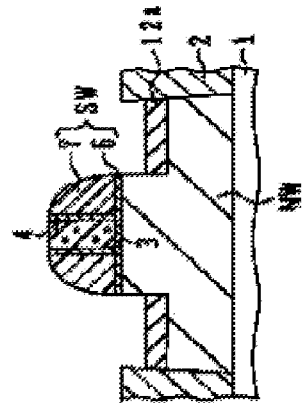
FIGS. 3A to 3F are schematic cross-sectional views showing the steps in the manufacturing method of the semiconductor device shown in FIG. 2.

As shown in FIG. 3A, the element isolating region 2 is formed in the Si substrate with the STI method to define a plurality of active regions. An n-type impurity is ion-implanted to the active region for PMOS transistor to form an n-type well NW. A p-type impurity is ion-implanted to the active region for NMOS transistor to form a p-type well. The Si surface in the active region is exposed and a silicon oxide film is grown in the thickness of 1 nm to 2 nm with the thermal oxidation. Here, it is also possible to introduce nitrogen from the surface to form a silicon nitride oxide film. The silicon oxide film may also be laminated with another insulating film(s) having higher dielectric coefficient by the Chemical Vapor Deposition (CVD) method or the like. A gate insulating film 3 can be formed as explained above. A polysilicon film 4 is deposited over the gate insulating film 3 with the CVD method. Alternative to this process, an amorphous silicon film may be formed over the gate insulating film 3, followed by heat treatment for crystallization to form a polysilicon film. The p-type impurity is ion-implanted into the polysilicon film 4 of the PMOS transistor. A photoresist mask PR is formed over the polysilicon film 4, the polysilicon film 4 is etched and the gate electrode is then patterned. Thereafter, the photoresist mask PR is removed.

Figure 3B:
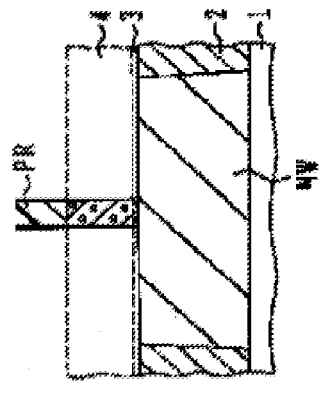

As shown in FIG. 3B, the silicon oxide film 6 and the silicon nitride film 7 are deposited over the Si substrate with the CVD method and then the side-wall spacer SW on the gate electrode side-wall is left by conducting the anisotropic etching with the reactive ion etching method. Material and number of layers of side-wall spacer may be changed variously.

Figure 3C:
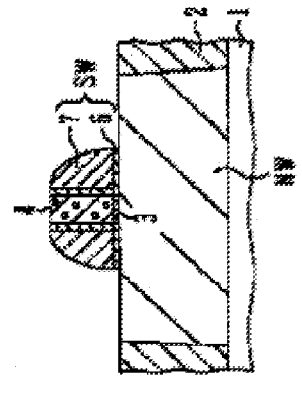

As shown in FIG. 3C, the Si substrate in both sides of the side-wall spacer SW is etched with the reactive etching method using HBr as the etching gas with such side-wall spacer SW used as the mask in view of forming the recess 11.

Figure 3D:
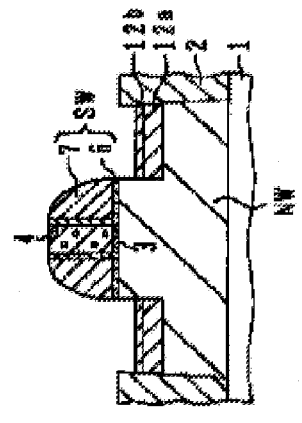

As shown in FIG. 3D, the first SiGe layer 12a is epitaxially grown. The SiGe mixed crystal with Ge composition of 0.2 to 0.4 is epitaxially grown to a thickness less than the critical film thickness, for example, 20 nm in a substrate temperature ranging from 500° C. to 700° C. using the mixed gas of $SiH_4$, $GeH_4$, HCl, $H_2$ and $B_2H_6$.

Figure 3E:
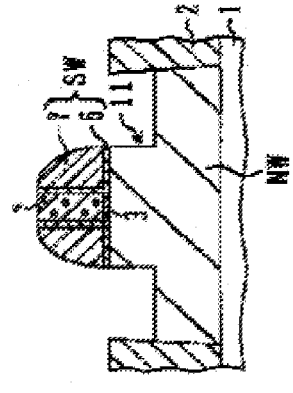

As shown in FIG. 3E, the supply rate of $GeH_4$ gas is reduced and the second SiGe layer 12b with Ge composition of 0 to 0.2 is epitaxially grown over the first SiGe layer 12a. For example, the Si layer is grown in the thickness of 3 nm.

Figure 3F:
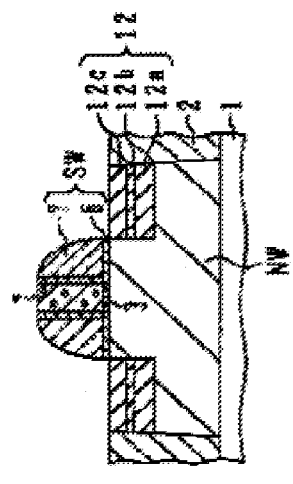

As shown in FIG. 3F, the supply rate of $GeH_4$ gas is increased again and the third SiGe layer 12c with Ge composition of 0.2 to 0.4 is epitaxially grown over the second SiGe layer 12b. Here, it is also possible to keep the flow rate of mixed gas to a constant rate by adjusting supply rate of $H_2$ as required.

As explained above, the first, second, and third SiGe layers 12a, 12b, 12c are embedded in the recess. A sum of thickness of the first and third SiGe epitaxial layers 12a, 12c with Ge composition of 0.2 to 0.4 is larger than the critical film thickness. Generation of dislocation can be controlled even when the SiGe epitaxial layer is grown to a thickness as the sum of thicknesses exceeding the critical film thickness by providing the second SiGe epitaxial layer with lower Ge composition at the intermediate portion. Since the SiGe epitaxial layer having the total thickness larger than the critical film thickness can be allocated, a larger compressed stress may be applied to the channel region of the PMOS transistor. Thereby, mobility of holes may be improved with a large compressed stress.

Here, it is also allowed that the SiGe epitaxial layer with lower Ge composition and the SiGe epitaxial layer with higher Ge composition are further formed over the laminated layers of three layers. Number of layers of the laminated layer may be selected as required.

Figure 4:
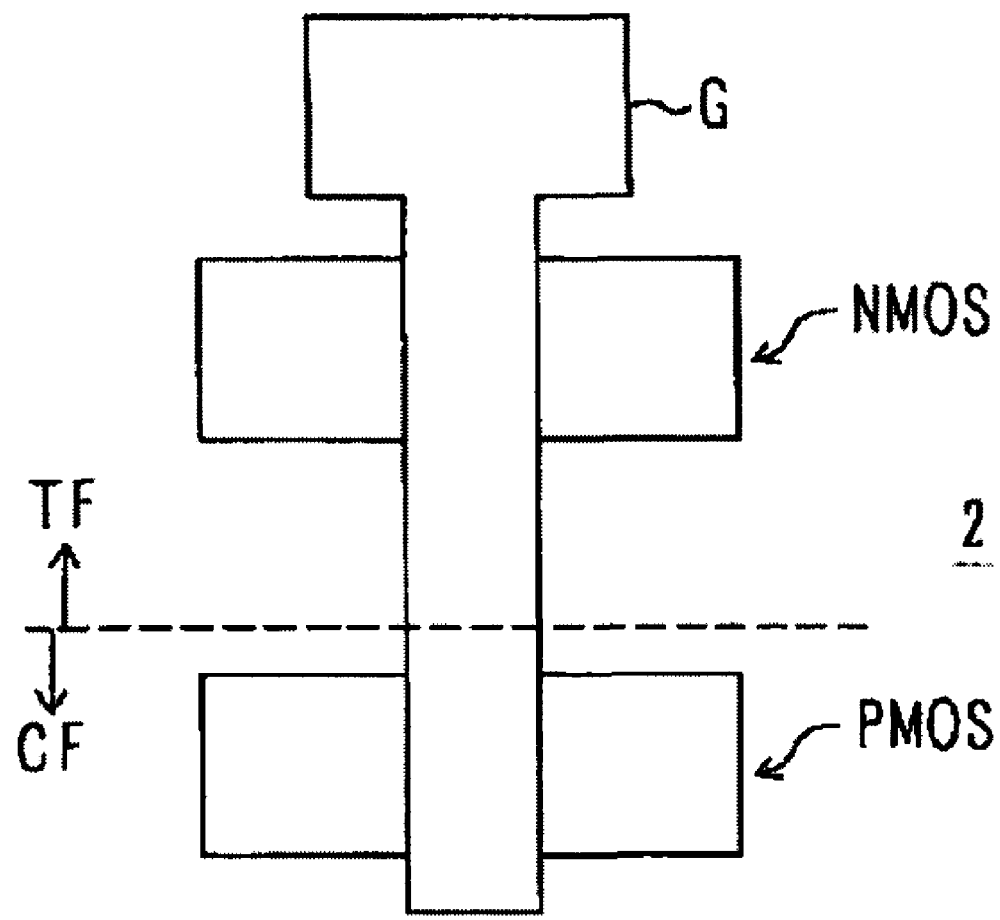
FIG. 4 is a schematic plan view of the CMOS device of the second embodiment.

FIG. 4 is a plan view showing a part of a CMOS transistor device of the second embodiment. An active region for NMOS transistor and an active region for PMOS transistor are formed. A gate electrode G is formed traversing the NMOS transistor region and the PMOS transistor region. The Si substrate in both sides of the gate electrode is etched in at least one of the NMOS transistor region and PMOS transistor region in view of forming the recess. The SiGe laminated layer is epitaxially formed within the recess in the case of the EMOS transistor, while the SiC laminated layer is formed in the case of the NMOS transistor. In the case of the SiGe laminated layer for embedding the recess form source/drain of the PMOS transistor, this layer is identical to the laminated layer of the SiGe laminated layer explained with reference to FIGS. 2A, 2B, and 3F. In the case of the SiC laminated layer embedding the recess for source/drain of the NMOS transistor, conductivity type of impurity explained with reference to FIGS. 2A, 2B, and 3F is inverted, SiC is substituted for SiGe, and C composition is substituted for Ge composition.

Here, a film TF for applying a tensile stress such as a silicon nitride film may be deposited by the thermal CVD method covering the NMOS transistor and a film CF for applying a compressed stress such as silicon nitride film may also be deposited by the plasma CVD method covering the PMOS transistor. In this case, it is preferable that the boundary of both stress films is formed nearer to the PMOS transistor than the NMOS transistor. The reason is that the tensile stress can improve mobility in both NMOS transistor and PMOS transistor in regard to the stress in the channel width direction. Here, it is also possible that the SiGe epitaxial laminated layer is embedded in the source/drain of the PMOS transistor to form the film TF for applying the tensile stress to the entire surface of the substrate.

The present invention is not limited only to these embodiments. For example, Moreover, various modifications, additions, improvements, substitutions and combinations of such contents may also be apparent for those who are skilled in this art.

What is claimed is:

1. A method of manufacturing a semiconductor device comprising:

forming a gate insulating film and a gate electrode over a Si substrate;

etching the Si substrate using the gate electrode as a mask to form a recess in the Si substrate;

forming a first Si layer including Ge in the recess; forming an interlayer over the first Si layer; forming a second Si layer including Ge over the interlayer;

wherein the interlayer is composed of Si or Si including Ge, and Ge concentration of the interlayer is less than a Ge concentration of the first Si layer and a Ge concentration of the second Si layer.

2. The method of manufacturing the semiconductor device according to claim 1, wherein the first Si layer is formed by epitaxial growth, the interlayer is formed by epitaxial growth, and the second Si layer is formed by epitaxial growth.

3. The method of manufacturing the semiconductor device according to claim 1, wherein a thickness of each of the first Si layer, and the second Si layer is equal to or less than a critical film thickness.

4. The method of manufacturing the semiconductor device according to claim 1, wherein the Ge concentration of the first Si layer and the Ge concentration of the second Si layer is in a range from 20% to 40% in atomic %.

5. The method of manufacturing the semiconductor device according to claim 1, wherein each of the source and the drain region includes B as p-type impurity, and the concentration of B is in the range from $1 \times 10^{19}$ cm$^{-3}$ to $1 \times 10^{21}$ cm$^{-3}$.

* * * * *